United States Patent
Kang

(10) Patent No.: US 7,826,269 B2
(45) Date of Patent: *Nov. 2, 2010

(54) FLASH MEMORY DEVICE AND METHOD FOR DRIVING THE SAME

(75) Inventor: Sang-gu Kang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 245 days.

This patent is subject to a terminal disclaimer.

(21) Appl. No.: 12/052,003

(22) Filed: Mar. 20, 2008

(65) Prior Publication Data

US 2008/0247247 A1 Oct. 9, 2008

(30) Foreign Application Priority Data

Apr. 4, 2007 (KR) ...................... 10-2007-0033369

(51) Int. Cl.
*G11C 11/34* (2006.01)
(52) U.S. Cl. .............. 365/185.18; 365/201; 365/185.17
(58) Field of Classification Search ............ 365/185.18, 365/201, 185.17, 189.05, 189.03, 230.06, 365/230.08

See application file for complete search history.

(56) References Cited

U.S. PATENT DOCUMENTS 6,615,302 B1 * 9/2003 Birns ........................ 710/121
2004/0255205 A1 * 12/2004 Oodate et al. ................. 714/54
2006/0023549 A1 2/2006 Son et al.
2008/0043534 A1 * 2/2008 Kawamoto et al. ..... 365/185.17

FOREIGN PATENT DOCUMENTS

| JP | 20040246958 | 9/2004 |
|----|-------------|--------|
| KR | 1020030023762 A | 3/2003 |
| KR | 1020060125495 A | 12/2006 |

\* cited by examiner

*Primary Examiner*—Dang T Nguyen
(74) *Attorney, Agent, or Firm*—Volentine & Whitt, P.L.L.C.

(57) ABSTRACT

Provided are a flash memory device and a method of driving the same for improving reliability of stored set information. The method of driving the flash memory device includes applying power to the flash memory device, the flash memory device having a memory cell array for storing set information regarding operation environment settings, where the set information includes at least one bit. The method further includes performing an initial read operation on the memory cell array and judging a status of data, corresponding to the set information, read during the initial read operation to determine whether the initial read operation has passed or failed. Each bit of the set information is extended to n bits (where n is an integer equal to or greater than 2). The n bits are respectively stored in different input/output regions in the memory cell array.

22 Claims, 9 Drawing Sheets

FLASH MEMORY DEVICE AND METHOD FOR DRIVING THE SAME

CROSS-REFERENCE TO RELATED PATENT APPLICATION

A claim of priority is made to Korean Patent Application No. 10-2007-0033369, filed on Apr. 4, 2007, the subject matter of which is hereby incorporated by reference.

BACKGROUND OF THE INVENTION

1. Field of the Invention

The present invention relates to a flash memory device, and more particularly, to a flash memory device and a method of driving the same in which reliability of set information is determined in an initial read operation.

2. Description of the Related Art

A flash memory device is a nonvolatile memory device capable of electrically erasing and storing data. The flash memory device has power consumption lower than that of a recording medium based on a magnetic disk memory, and an access time as fast as a hard disk of the magnetic disk memory.

The flash memory device may be classified as a NOR type or a NAND type according to the state of connection of cells and bit lines. In a NOR type flash memory device, at least two cell transistors are connected in parallel with a single bit line. The NOR type flash memory device stores data using channel hot electrons and erases data using Fowler-Nordheim (F-N) tunneling. A NAND type flash memory device has at least two cell transistors serially connected to a single bit line. The NAND type flash memory device stores and erases data using F-N tunneling. The NOR type flash memory device has a high operating speed, although the NOR type flash memory device cannot be highly integrated due to high current consumption. The NAND type flash memory device has an advantage in terms of high integration because the NAND type flash memory device uses a cell current lower than that of the NOR type flash memory device.

FIG. 1A is a circuit diagram of memory cells included in a conventional NAND type flash memory device. Referring to FIG. 1A, the conventional NAND type flash memory device includes memory cells M11, M12, M13 and M14, multiple wordlines WL11, WL12, WL3 and WL14, select transistors ST1 and ST2, and a bit line BL. The memory cells M1, M12, M13 and M14 and the select transistors ST1 and ST2 form a string and are connected in series between the bit line BL and a ground voltage VSS. The conventional NAND type flash memory device programs all the memory cells connected to a single wordline at a time because the conventional NAND type flash memory device uses a low cell current.

FIG. 1B is a circuit diagram of memory cells M21 through M26 included in a conventional NOR type flash memory device. Referring to FIG. 1B, the memory cells M21 through M26 are connected between bit lines BL1 and BL2 and a source line CSL. The conventional NOR type flash memory device programs a predetermined number of memory cells through a one-time programming operation because the programming of the conventional NOR type flash device involves high current consumption.

Set information required for a memory operation must be included in a memory device. An electrical fuse (E-fuse) method is a method that stores information in a memory cell, reads the information when a memory chip is operated and turns on/off a corresponding switch to transmit the information. The information stored based on the E-fuse method includes DC trim information, option information, repair information and bad block information for operation of the memory chip. This information is previously stored when a specific region of memory cells is tested.

When power is applied to the memory chip, the set information is read and stored in a latch, and a corresponding switch is turned on/off using the information stored in the latch. As such, various DC levels are set using the information required for the memory operation and column defects and block defects are repaired using the information.

However, the information stored based on the E-fuse method is recorded in a main memory cell that may have a defect, and the information is programmed and read even though the defect has not been repaired. Therefore, the programming and reading operations are affected by the defect in the main memory cell. In other words, when the information related to memory operation is programmed or read, the programming and reading operations may be performed on a memory cell having a defect, and thus the programmed and read information may have an error. An operating environment of the memory device may be incorrectly set. Further, an error can be generated due to fluctuation of a power level when the information is programmed and read. Therefore, the operations of programming and reading information stored based on the E-fuse method are not reliable.

SUMMARY OF THE INVENTION

The present invention provides a flash memory device and a method for driving the same, to improve reliability of an operation of reading set information stored in a memory cell array.

According to an aspect of the present invention, there is provided a method of driving a flash memory device, having a memory cell array for storing set information regarding operation environment settings, the set information including at least one bit. The method includes applying power to the flash memory device; performing an initial read operation on the memory cell array; and judging a status of data, corresponding to the set information, read during the initial read operation to determine whether the initial read operation has passed or failed. Each bit of the set information is extended to n bits (where n is an integer equal to or greater than 2), and the n bits are respectively stored in different input/output regions in the memory cell array.

The memory cell array may include m input/output regions (where m is an integer equal to or greater than n) from which data bits are simultaneously output according to a single address. The extended n bits may be respectively stored in n input/output regions from among the m input/output regions.

Performing the initial read operation may include simultaneously outputting the extended n bits according to a single address.

Judging the status of the data read during the initial read operation may include judging a status of the extended n bits to determine whether the initial read operation has passed or failed. Determining whether the initial read operation has passed or failed may include setting a reference value and determining whether a number of "1" bits or "0" bits in the extended n bits is the same as or greater than the reference value. Determining whether the initial read operation has passed or failed may include determining whether a number of "1" bits or a number of "0" bits from among the n bits is greater.

Each bit of the set information may be extended such that the n bits include a combination of "0" bits and "1" bits using a coding method. Determining whether the initial read operation has passed or failed may include decoding the n bits by inverting at least one bit of the extended n bits and judging a status of the decoded n bits to determine whether the initial read operation has passed or failed.

The method may further include storing 1-bit valid data in a latch according to the extended n bits when it is determined that the initial read operation has passed.

The method may further include re-reading the set information when it is determined that the initial read operation has failed. Also, the method may further include setting a maximum loop value corresponding to a predetermined integer; and repeating the re-reading of the set information a number of times that does not exceed the maximum loop value when it is determined that the initial read operation has failed.

According to another aspect of the present invention, there is provided a method of driving a flash memory device including applying power to the flash memory device, the flash memory device having a memory cell array storing set information regarding operation environment settings. The method further includes performing an initial read operation on the memory cell array, and judging a status of data, corresponding to the set information, read during the initial read operation to determine whether the initial read operation has passed or failed. The set information has at least one bit, and each bit of the set information is extended to n bits (where n is an integer equal to or greater than 2), such that the n bits have a combination of data statuses using a coding method.

According to another aspect of the present invention, there is provided a flash memory device a memory cell array, a data determination unit and a control logic circuit. The memory cell array stores set information regarding operation environment settings and includes multiple input/output regions from which data is output according to a single address. The data determination unit receives data corresponding to the set information, read during an initial read operation when power is applied to the flash memory device, and determines a status of the data. The control logic circuit controls the initial read operation and an operation environment settings operation of the flash memory device according to the determined status of the data. The set information includes at least one bit, each bit of the set information being extended to n bits (n is an integer equal to or greater than 2). The n bits are respectively stored in different input/output regions in the memory cell array.

According to another aspect of the present invention, there is provided a flash memory device including a memory cell array for storing set information regarding operation environment settings, each bit of the set information being extended to n bits (where n is an integer equal to or greater than 2) and stored in the memory cell array. A data determination unit receives data corresponding to the set information read during an initial read operation when power is applied to the flash memory device, and determines a status of the data. A control logic circuit controls the initial read operation and an operation environment settings operation of the flash memory device according to the determined status. Each bit of the set information is coded into n bits having a combination of data statuses.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
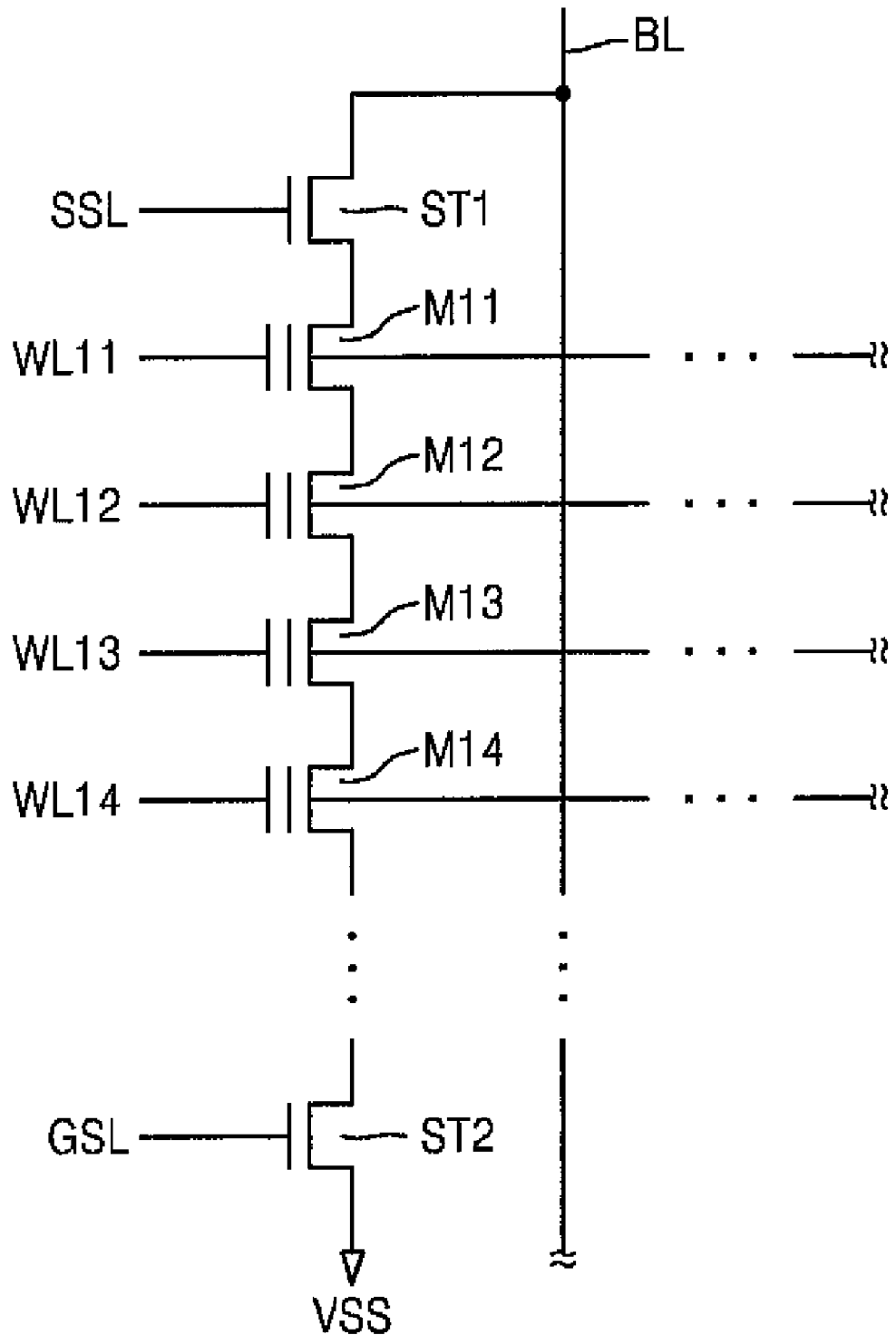
FIG. 1A is a circuit diagram of memory cells included in a conventional NAND type flash memory device.
Figure 1B:
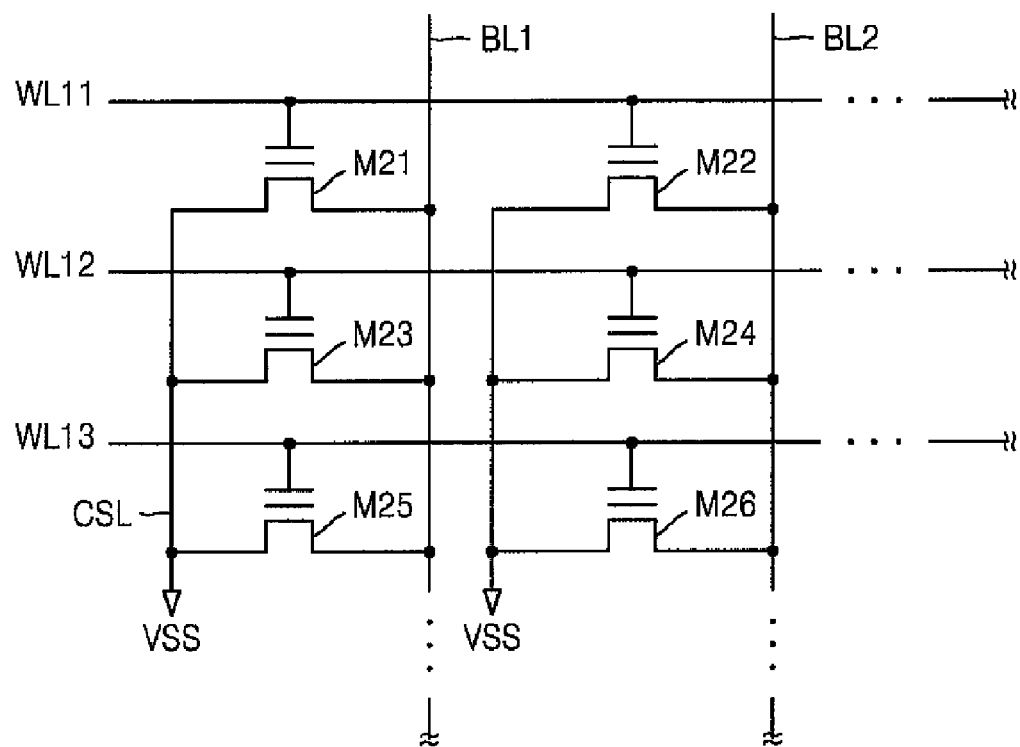
FIG. 1B is a circuit diagram of memory cells included in a conventional NOR type flash memory device.

The present invention will now be described more fully with reference to the accompanying drawings, in which exemplary embodiments of the present invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
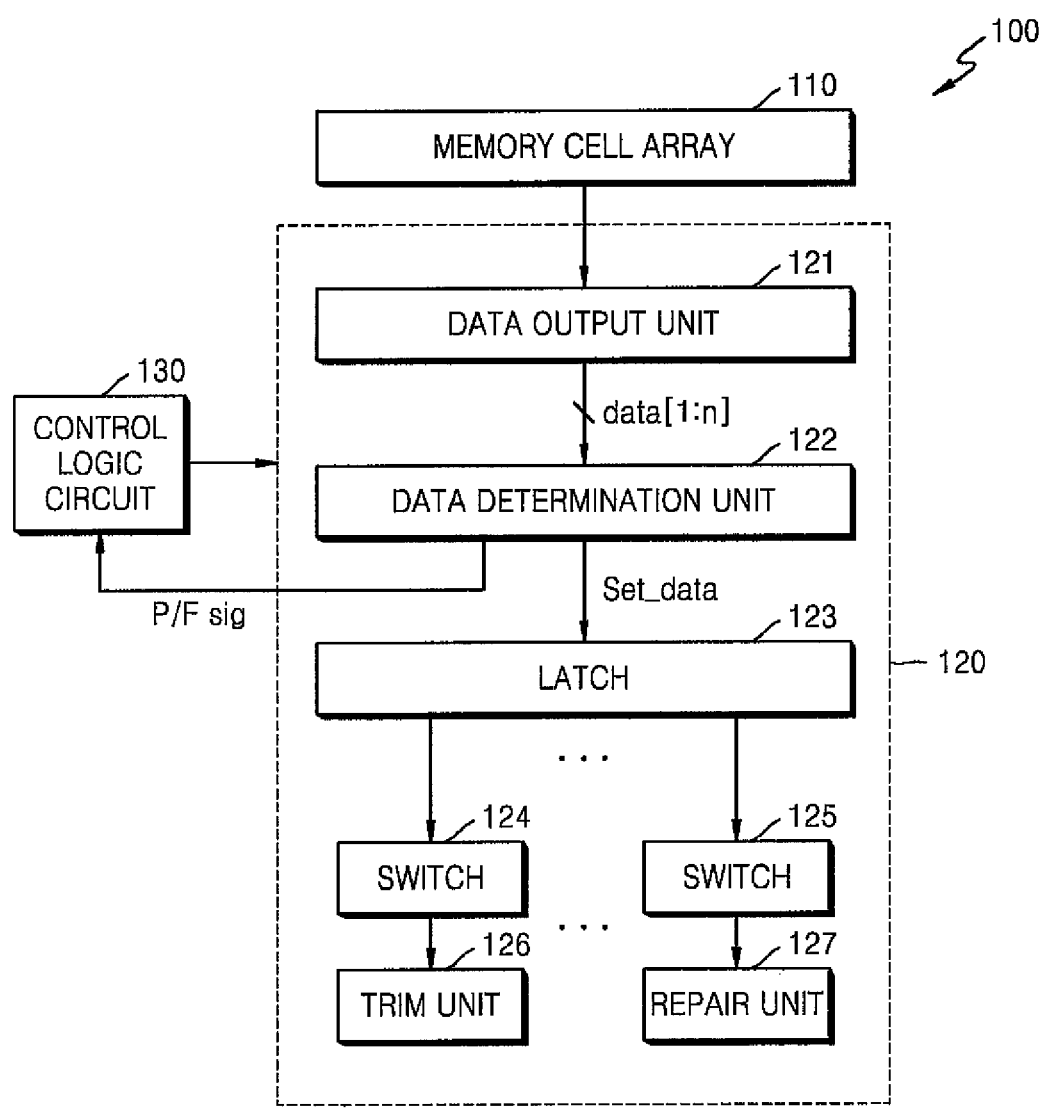
FIG. 2 is a block diagram of a flash memory device, according to an exemplary embodiment of the present invention.

FIG. 2 is a block diagram of a flash memory device 100, according to an illustrative embodiment of the present invention. Referring to FIG. 2, the flash memory device 100 includes a memory cell array 110, a peripheral circuit 120 for programming, reading and performing other operations on the memory cell array 110, and a control logic unit 130 for controlling operation of the flash memory device 100.

The flash memory device 100 employs an Electrical fuse (E-fuse) method and stores set information regarding operating environment settings in the memory cell array 110. For example, the set information may include DC trim information, option information, repair information and bad block information. When power is applied to the flash memory device 100, an initial read operation is performed on the memory cell array 110 in which the set information is stored. The set information read in the initial read operation is stored in a predetermined latch (e.g., latch 123), as discussed below. Thus, the operation environment of the flash memory device 100 is set based on the set information.

The set information includes at least one bit. Each bit of the set information may be extended to n bits (where n is an integer equal to or greater than 2) and stored in the memory cell array 110. For example, one bit included in the set information may be extended to eight bits and then stored in the memory cell array 110. That is, a bit of "1" is extended to "11111111" and stored in the memory cell array 110, and a bit of "0" is extended to "00000000" and stored in the memory cell array 110.

The memory cell array 110 may be divided into one or more domains. Each domain may consist of multiple input/output regions from which data bits are simultaneously output according to a single address. For example, if the memory cell array 110 includes m input/output regions (where m is an integer equal to or greater than n) from which data bits are simultaneously output according to a single address, the extended n bits [1:n] are respectively stored in n input/output regions from among the m input/output regions.

The peripheral circuit 120 includes a data output unit 121, a data determination unit 122, a latch 123, switches 124 and 125, a trim unit 126 and a repair unit 127. The data output unit 121 receives data read from the memory cell array 110 and controls the output of the data. The data output unit 121 may include a page buffer (not shown) and an input/output buffer (not shown), and provide the extended n bits [1:n] of the set information that are simultaneously output to the data determination unit 122, according to the single address. The data determination unit 122 receives the extended n bits [1:n] and judges the status of the received n bits [1:n]. The data determination unit 122 determines whether the initial read operation has passed or failed based on the judgment result, and outputs a P/F signal accordingly.

More specifically, the data determination unit 122 judges the status of the received n bits [1:n] and determines whether the number of "1" bits or "0" bits from among the n bits is greater than (or equal to) a predetermined reference value. For example, when a bit of "1" of the set information is extended to eight bits (i.e., "11111111") and stored in the memory cell array 110, and the reference value is 7, the data determination unit 122 determines that the initial read operation has passed. Accordingly, it outputs a P/F signal according to the determination result when the number of "1" bits (or "0" bits) from among the n bits is greater than 7. If the number of "1" bits (or "0" bits) in the n bits is less than 7, the data determination unit 122 determines that the initial read operation has failed, and outputs the P/F signal according to the determination result. To achieve this, the data determination unit 122 may include a counter (not shown), which counts the number of at least one of the "1" bits and "0" bits.

The control logic circuit 130 controls the initial read operation and the operation environment settings of the flash memory device 100 according to the determination result of the data determination unit 122. When the P/F signal indicates that the initial read operation has passed, the control logic circuit 130 controls the data determination unit 122 to output valid data Set_data. For example, when the number of "1" bits in the n bits [1:n] is greater than seven, a "1" bit is output as the valid data Set_data. As shown in the example illustrated in FIG. 2, the valid data Set_data may be directly output from the data determination unit 122 to the latch 123. It is understood, however, that the transfer of the valid data Set_data is not limited to this configuration. For example, the control logic circuit 130 can receive the P/F signal and the n bits and output the valid data Set_data to the latch 123, when it is determined that the initial read operation has passed, based on the P/F signal.

When it is determined that the initial read operation has failed, the control logic circuit 130 controls the peripheral circuit 120 to re-read the set information. For example, for a read operation of the flash memory device 100, a voltage applied to the flash memory device 100 must be sufficiently increased to a read level. However, the initial read operation of the flash memory device 100 may occur even if the voltage has not been sufficiently increased to the read level, resulting in incorrect data. Accordingly, it is possible to pass the initial read operation by re-reading the set information. In the re-read operation, a maximum loop value corresponding to a predetermined integer can be set in the control logic circuit 130. The control logic circuit 130 may control the re-read operation to be repeated a number of times less than the maximum loop value, if the initial read operation fails.

In an embodiment, the data determination unit 122 can determine whether the number of "1" bits or the number of "0" bits in the extended n bits [1:n] is greater. The data determination unit 122 then respectively outputs "1" or "0" as the valid data Set_data when the number of "1" bits or "0" bits of the extended n bits [1:n] is greater. For example, when it is determined that the number of "1" bits is greater than the number of "0" bits, "1" is output as the valid data Set_data to the latch 123. A logic circuit configuration capable of determining the valid data signal based on a majority of data bits would be apparent one skilled in the art, so a detailed explanation thereof is not included.

The valid data Set_data is provided to the latch 123, as described above. The set information regarding the operation environment settings may be determined by combining the valid data Set_data. The set information stored in the latch 123 is provided to the switches 124 and 125 to control the on and off states of the switches 124 and 125. At least one of the trim unit 126 and the repair unit 127 are controlled according to the on and off states of the switches 124 and 125.

Operation of the flash memory device 100 will now be explained with reference to FIGS. 3, 4 and 5.

Figure 3:
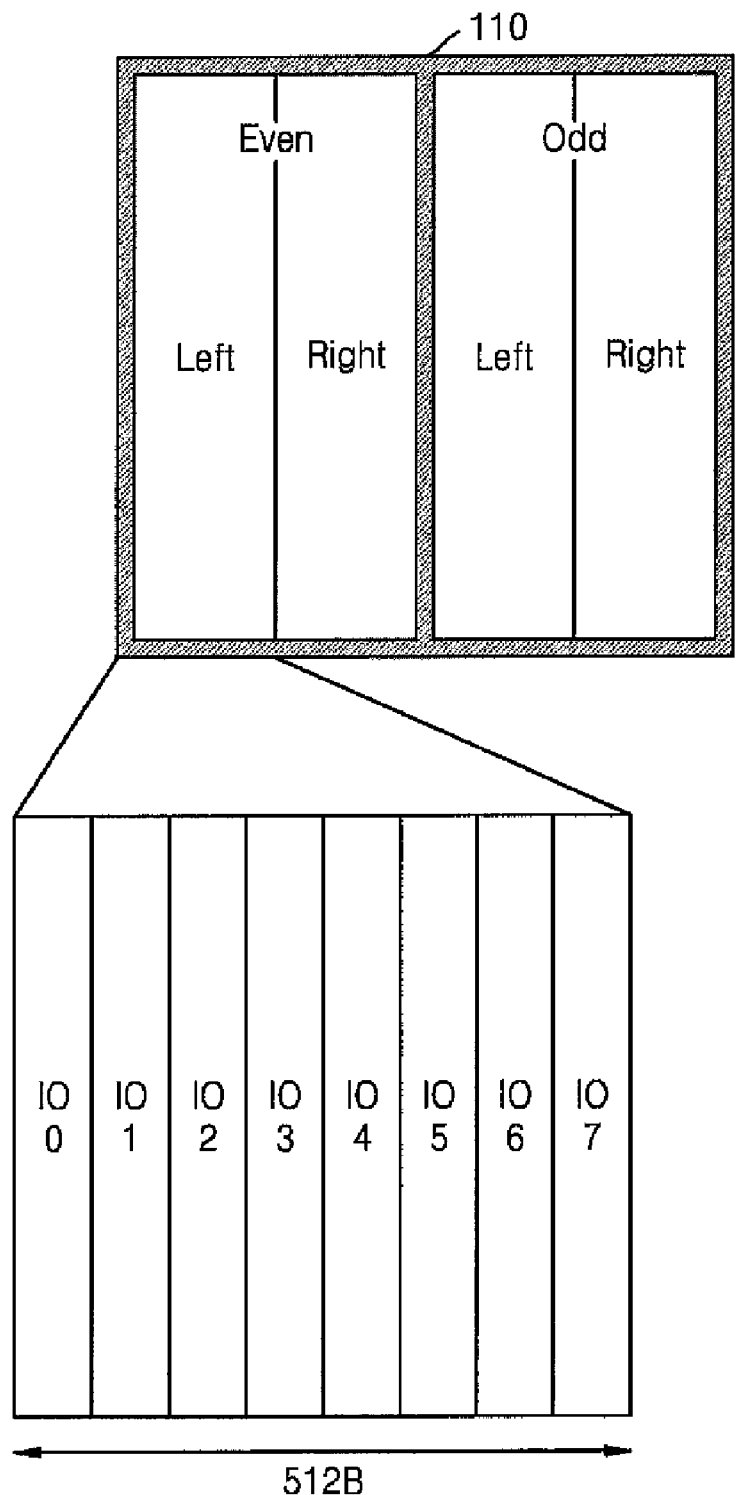
FIG. 3 illustrates a structure of a memory cell array included in the flash memory device illustrated in FIG. 2, according to an exemplary embodiment of the present invention.

FIG. 3 illustrates a structure of the memory cell array 110 included in the flash memory device 100 illustrated in FIG. 2, according to an illustrative embodiment of the present invention. The memory cell array 110 included in the flash memory device 100 can be divided into an even region and an odd region for an interleaving operation. Each of the even region and the odd region can be divided into a left part and a right part. When each page of the memory cell array 110 has 2 Kbytes, the left part and the right part of each region respectively have 512 bytes. For example, the left part of the even region can include a column corresponding to eight input/output regions IO0 through IO7. One-bit data is output from each of the eight input/output regions IO0 through IO7 for a single address, and the eight bits respectively output from the eight input/output regions IO0 through IO7 correspond to one byte.

Figure 4:
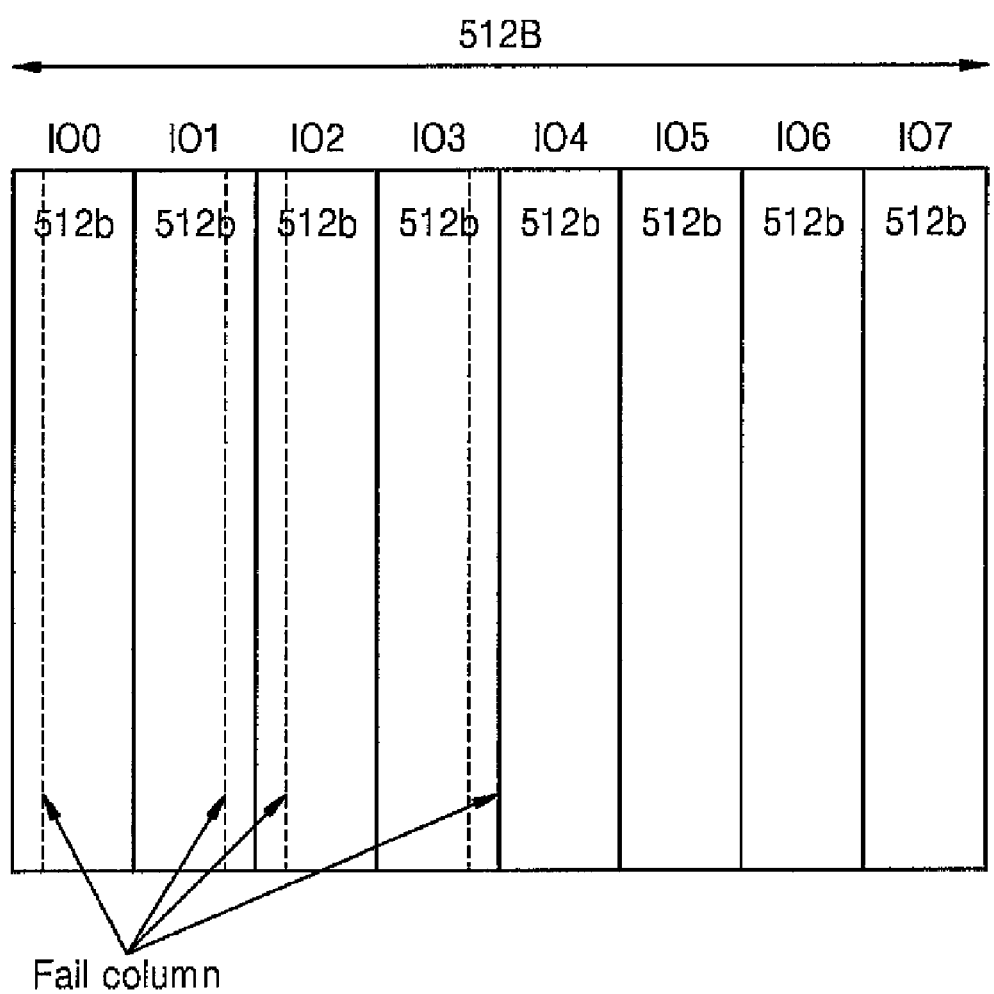
FIG. 4 illustrates column defects generated in the memory cell array of the flash memory device illustrated in FIG. 2, according to an exemplary embodiment of the present invention.

FIG. 4 illustrates column defects generated in the memory cell array 110. Referring to FIG. 4, eight input/output regions IO0 through IO7 correspond to a 512-byte column, and the column defects are randomly located in the eight input/output regions IO0 through IO7. In the depicted example, when the flash memory device 100 is tested, only a defect generated in a single input/output region from among the eight input/output regions IO0 through IO7 corresponding to a single address is allowed. When two or more defects are generated, the flash memory device 100 is determined to be a failed die. When no or only a single input/output region from among the eight input/output regions IO0 through IO7 corresponding to a single address has a defect, the flash memory is determined to be a pass die.

Accordingly, each bit of the set information is extended to n bits [1:n] and stored in the memory cell array 110. Here, the n bits are respectively stored in different input/output regions of the memory cell array 110. For example, extended eight bits are respectively stored in the eight input/output regions IO0 through IO7. In this case, the probability that an error is generated in the extended eight bits is less than one bit in the initial read operation, and the generation of an error can be minimized when the extended bits are read even when progressively generated defects are considered.

Figure 5A:
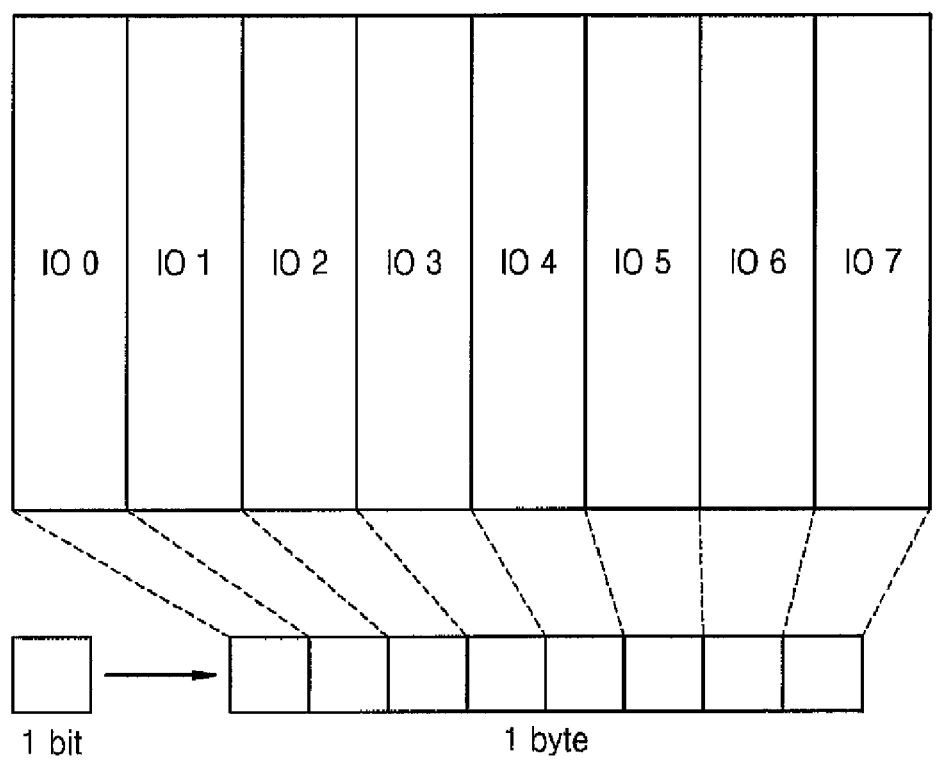
FIGS. 5A and 5B illustrate an extension of bits of set information, according to an exemplary embodiment of the present invention.
Figure 5B:
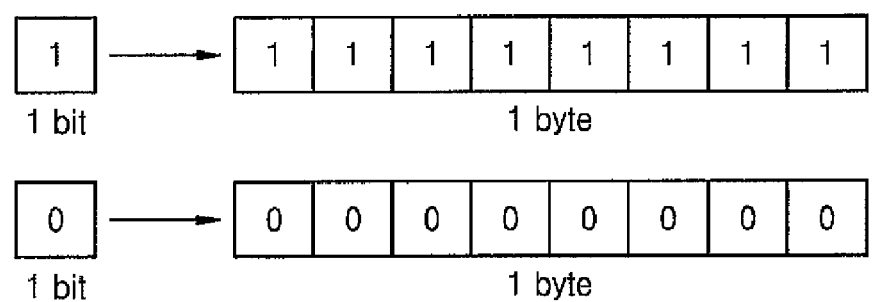

FIGS. 5A and 5B illustrate an extension of each bit of set information according to an illustrative embodiment of the present invention. Referring to FIG. 5A, the memory cell array 110 includes eight input/output regions IO0 through IO7 simultaneously outputting data bits according to a single address, and 1-bit set information is extended to 8-bit data and stored in the memory cell array 110. Referring to FIG. 5B, a bit of "1" of the set information is extended to "11111111" and respectively stored in the eight input/output regions IO0 through IO7. Also, a bit of "0" of the set information is extended to "00000000" and respectively stored in the eight input/output regions IO0 through IO7.

The data determination unit 122 receives the set information data [1:n] read during the initial read operation and judges the status of the set information data [1:n]. Specifically, the data determination unit 122 receives the extended 8-bit data, determines that the initial read operation has passed when the number of "1" bits is greater than a reference value, and outputs the P/F signal according to the determination result. In this example, "1" is provided as the valid data Set_data to the latch 123. Thus, an error generated due to a column defect, e.g., when the set information for setting an operation environment is read, can be removed.

Figure 6A:
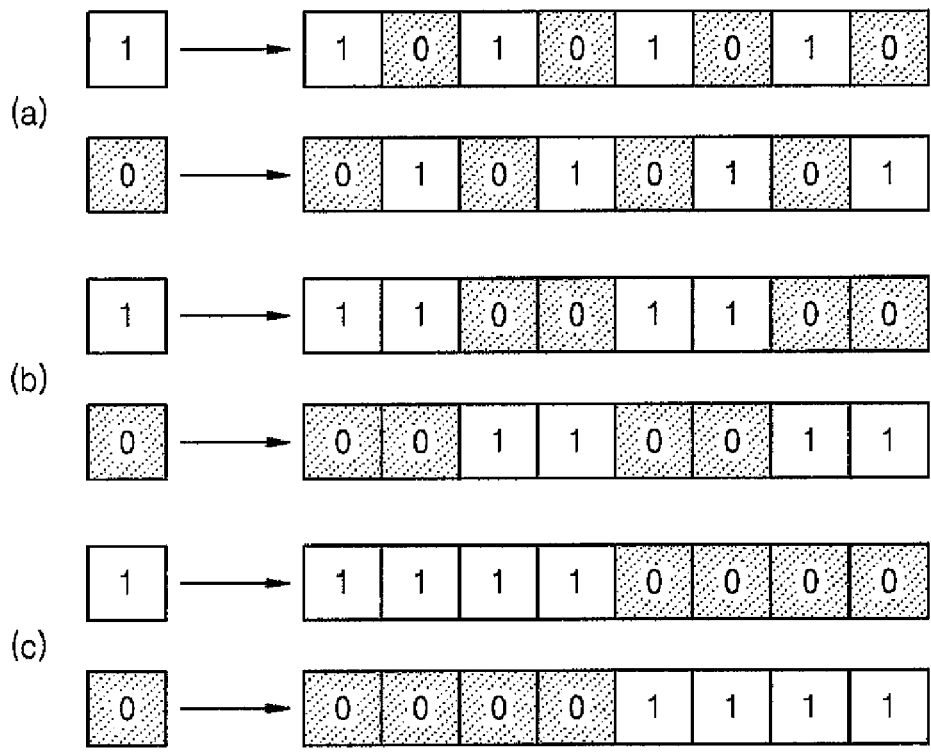
FIG. 6A illustrates an extension of bits of set information, according to another exemplary embodiment of the present invention.
Figure 6B:
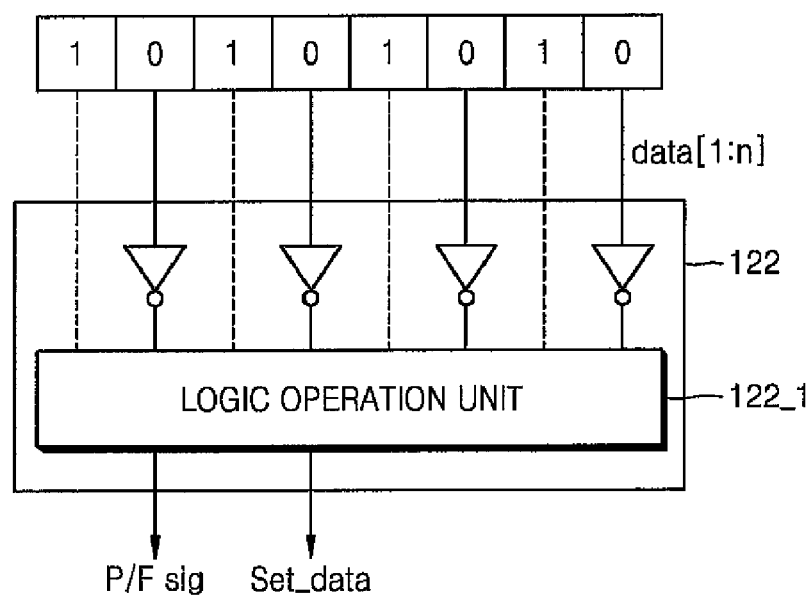
FIG. 6B illustrates a method of determining the status of read set information.

FIG. 6A illustrates an extension of each bit of set information according to another illustrative embodiment of the present invention, and FIG. 6B illustrates a method of determining the status of the read set information.

Referring to FIG. 6A, each bit of the set information is extended to n bits such that the n bits have a combination of "0" bits and "1" bits based on a coding method. FIG. 6A (a) illustrates an example in which a bit of "1" of the set information is coded into eight bits "10101010" and a bit of "0" of the set information is coded into eight bits "01010101." FIG. 6A (b) illustrates an example in which a bit of "1" of the set information is coded into eight bits "11001100" and a bit of "0" of the set information is coded into eight bits "00110011." FIG. 6A (c) illustrates an example in which a bit of "1" of the set information is coded into eight bits "11110000" and a bit of "0" of the set information is coded into eight bits "00001111."

The coded set information data is more reliable than set information data in which each bit extended to n bits having the same value, as described with reference to FIGS. 5A and 5B (e.g., when a bit of "1" is extended to "11111111"). In particular, a problem may arise when a fluctuation occurs, e.g., when powering up or when power applied to the flash memory is not sufficiently increased to a read level, thus generating a data error. In other words, the extended bits may all be changed from "11111111" to "00000000" or from "00000000" to "11111111" in response to the fluctuation and read. It would then be incorrectly determined that the initial read operation has passed because the number of identical bits from among the extended n bits [1:n] is greater than the reference value. Accordingly, the valid data would include an error.

The method of extending bits of the set information as illustrated in FIGS. 6A and 6B addresses this potential problem. That is, a bit of "1" and a bit of "0" are extended to bits having a combination of "1s" and "0s" using a coding method. For example, a bit of "1" may be extended to "10101010" and a bit of "0" may be extended to "01010101," as shown in FIG. 6A (a). In this case, when a bit of "1" is wrongly read as "0" or a bit of "0" is wrongly read as "1," e.g., due to the instability of a power level, it can be determined that the initial read operation has failed. Accordingly, it is possible to prevent the generation of an error in the valid data.

FIG. 6B illustrates the data determination unit 122 judging the status of the read data when the set information bit is extended according to a coding method. When a "1" bit of the set information is extended to eight bits "10101010," as shown in FIG. 7A (a), and stored in the memory cell array 110, the eight bits read in the initial read operation are provided to the data determination unit 122.

The first determination unit 122 includes a decoder configured to receive n bits (eight bits in the depicted embodiment) extended according to the coding method, and to decode the n bits. The decoder may include at least one inverter for inverting some of the n bits. The n bits decoded by the decoder are provided to a logic operation unit 122_1. The logic operation unit 122_1 determines the number of bits having the same value and/or determines which of the number of "1" bits and the number of "0" bits is greater. Furthermore, the logic operation unit 122_1 generates a pass or fail P/F signal, indicating a pass or a failure according to the determination result, and generates the valid data Set_data corresponding to the n-bits.

Therefore, even when data bits are changed from "11111111" to "00000000" or changed from "00000000" to "11111111," e.g., due to power fluctuations or an insufficient increase to the read level, the data determination unit 122 is prevented from incorrectly passing the initial read operation. Also, even when a column defect is generated in the memory cell array 110, as described above, the generation of an error due to the column defect can be prevented. Thus, the reliability of reading the set information is improved.

Figure 7:
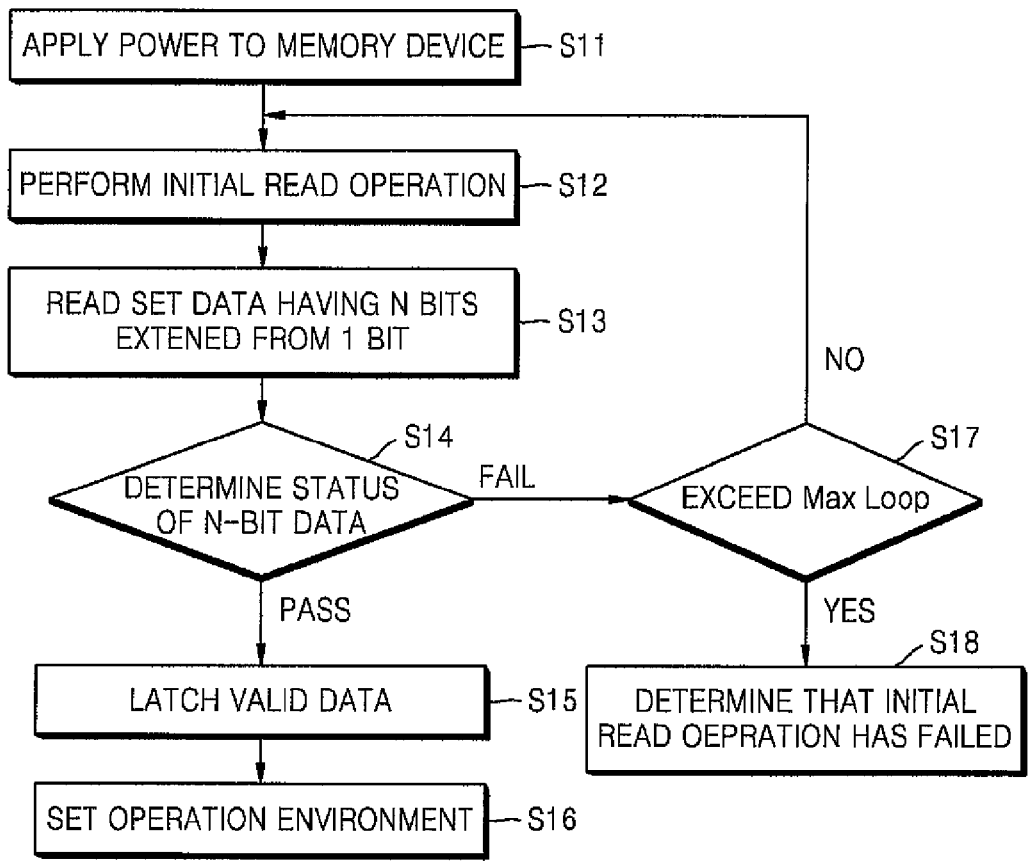
FIG. 7 is a flow chart of a method of driving a flash memory device, according to an exemplary embodiment of the present invention.

FIG. 7 is a flow chart of a method of driving a flash memory device 100, according to an illustrative embodiment of the present invention.

Referring to FIG. 7, power is applied to the flash memory device 100 including the memory cell array 110 in operation S11. The memory cell array 110 has stored set information related to operation environment settings. Each bit of the set information is extended to n bits and stored in the memory cell array 110. For example, a bit of "1" of the set information can be extended to eight bits "11111111." Alternatively, each bit of the set information can be extended to bits having coded combinations of "1s" and "0s." The extended bits are respectively stored in different input/output regions in the memory cell array 110.

When power is applied to the flash memory device 100, an initial read operation for reading the set information from the memory cell array 110 is performed in operation S12. The memory cell array 110 includes multiple input/output regions from which data bits are simultaneously output according to a single address. The extended n bits [1:n] are respectively stored in the input/output regions, and thus, the n bits are read during the initial read operation in operation S13.

In operation S14, the extended n-bit data is provided to the data determination unit 122 and the status of the n-bit data is judged by the data determination unit 122 to determine whether the initial read operation has passed or failed. As previously described, the data determination unit 122 determines whether the number of "1" bits or "0" bits in the n bits is greater than a predetermined reference value. The data determination unit 122 determines that the initial read operation has passed when the number of "1" bits or "0" bits is greater than the reference value, and determines that the initial read operation has failed when the number of "1" bits or "0" bits is not greater than the reference value. Alternatively, the data determination unit 122 may determine which one of the number of "1" bits and the number of "0" bits is greater to judge the status of the n-bit data.

When it is determined that the initial read operation has passed at operation S14, the set information is latched in the latch 123 in operation S15. Therefore, either a bit of "1" or "0" is latched as valid data according to the status of the corresponding n-bit data. For example, when the number of "1" bits in the eight bits is greater than seven, "1" is latched as the valid data. In this manner, the valid data is stored as set information in the latch 123 and an operation environment of the flash memory device 100 is set using the set information stored in the latch 123 in operation S16.

When it is determined that the initial read operation has failed in operation S14, the set information may be re-read, depending on the number of previous failures. A maximum loop value corresponding to a predetermined integer is set in the flash memory device 100, and it is determined whether the number of operations of reading the set information exceeds the maximum loop value in operation S17. When the number of operations of reading the set information does not exceed the maximum loop value, the set information is re-read by repeating operations S12, S13 and S14. When the number of re-reading operations exceeds the maximum loop value, it is determined that the flash memory device 100 has failed in operation S18.

Figure 8:
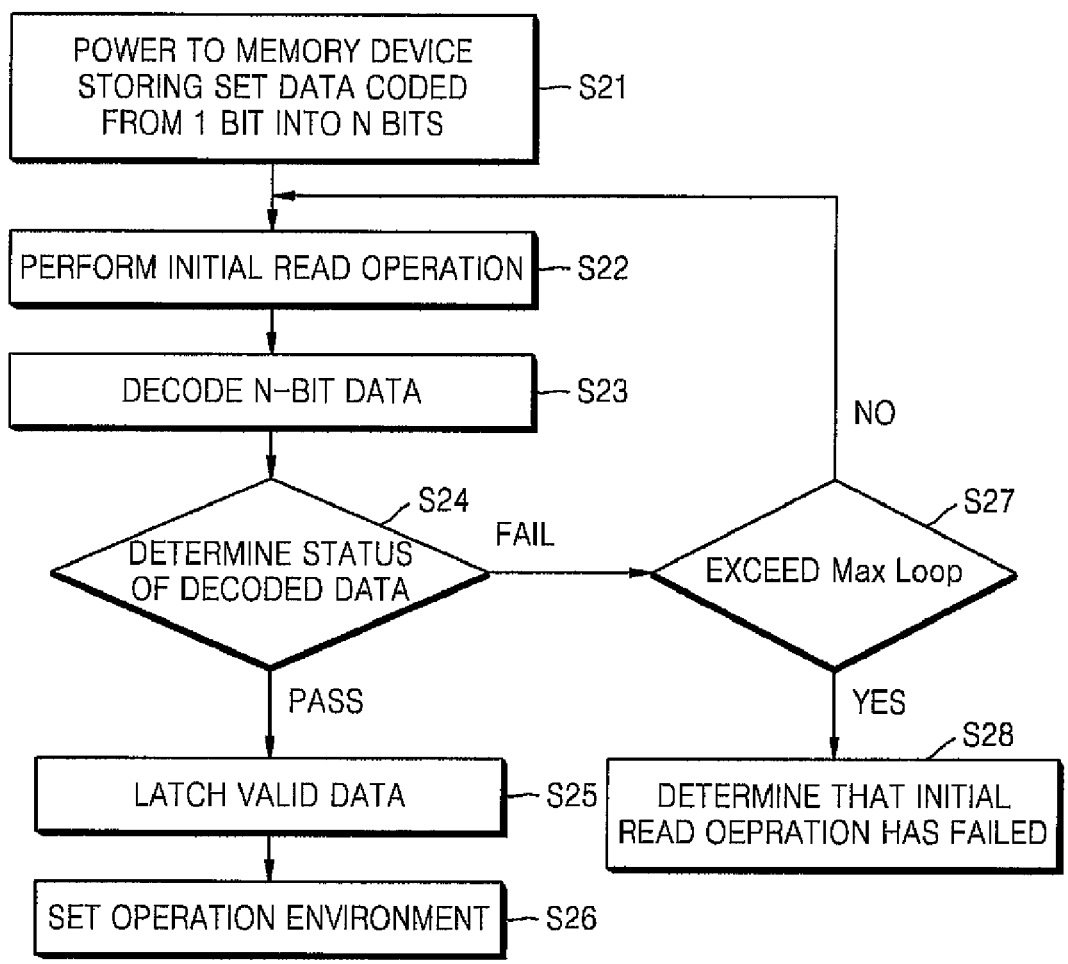
FIG. 8 is a flow chart of a method of driving a flash memory device, according to another exemplary embodiment of the present invention.

FIG. 8 is a flow chart illustrating a method of driving a flash memory device 100, according to another exemplary embodiment of the present invention.

Referring to FIG. 8, power is applied to the flash memory device 100 including the memory cell array 110 in operation S21, and thus, the memory cell array 110 stores set information related to operation environment settings. In accordance with various embodiments, each bit of the set information may be extended to n bits having a combination of "1" and "0" using a coding method.

When the power is applied to the flash memory device 100, an initial read operation, for reading the set information from the memory cell array 110, is performed in operation S22. The n-bit set information data is provided to the data determination unit 122 and decoded in operation S23. The n-bit data may be decoded in such a manner that a portion of the n bits is inverted. For example, a bit of "1" of the set information is extended to "10101010," and the "0" bits in "10101010" are inverted to "1" bits.

The status of the decoded n-bit data is judged to determine whether the initial read operation has passed or failed in operation S24. When it is determined that the initial read operation has passed, the set information is latched in the latch 123 in operation S25, and an operating environment of the flash memory device 100 is set using the latched set information in operation S26.

On the other hand, when it is determined in operation S24 that the initial read operation has failed, the set information may be re-read. Specifically, a maximum loop value corresponding to a predetermined integer is set in the flash memory device 100, and it is determined in operation S27 whether the number of operations of reading the set information exceeds the maximum loop value. When the number of operations of reading the set information does not exceed the maximum loop value, the set information is re-read by repeating operations S22, S23 and S24. When the number of re-reading operations exceeds the maximum loop value, it is determined that the flash memory device 100 has failed in operation S28.

As described above, according to embodiments of the present invention, the set information stored in a memory cell array can be stably read, even when column defects exist in the memory cell array and/or a power level is unstable. Accordingly, data reliability is improved.

While the present invention has been particularly shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a flash memory device, comprising:
   applying power to the flash memory device, including a memory cell array for storing set information regarding operation environment settings;
   performing an initial read operation on the memory cell array; and
   judging a status of data, corresponding to the set information, read during the initial read operation to determine whether the initial read operation has passed or failed,
   wherein the set information comprises at least one bit, each bit of the set information being extended to n bits (where n is an integer equal to or greater than 2), and the n bits are respectively stored in different input/output regions in the memory cell array,
   wherein performing the initial read operation comprises simultaneously outputting the extended n bits according to a single address, and
   wherein the judging of the status of the set information data read during the initial read operation comprises judging a status of the extended n bits to determine whether the initial read operation has passed or failed.

2. The method of claim 1, wherein the memory cell array includes m input/output regions (where m is an integer equal to or greater than n) from which data bits are simultaneously output according to a single address, and the extended n bits are respectively stored in n input/output regions from among the m input/output regions.

3. The method of claim 1, wherein performing the initial read operation comprises simultaneously outputting the extended n bits according to a single address.

4. The method of claim 1, wherein determining whether the initial read operation has passed or failed comprises setting a reference value and determining whether a number of "1" bits or "0" bits in the extended n bits is the same as or greater than the reference value.

5. The method of claim 1, wherein determining whether the initial read operation has passed or failed comprises determining whether a number of "1" bits or a number of "0" bits from among the n bits is greater.

6. The method of claim 1, wherein each bit of the set information is extended such that the n bits include a combination of "0" bits and "1" bits using a coding method.

7. The method of claim 6, wherein determining whether the initial read operation has passed or failed comprises decoding the n bits by inverting at least one bit of the extended n bits and judging a status of the decoded n bits to determine whether the initial read operation has passed or failed.

8. The method of claim 1, further comprising:
   storing 1-bit valid data in a latch according to the extended n bits when it is determined that the initial read operation has passed.

9. The method of claim 1, further comprising:
   re-reading the set information when it is determined that the initial read operation has failed.

10. The method of claim 9, further comprising:
    setting a maximum loop value corresponding to a predetermined integer; and repeating the re-reading of the set information a number of times that does not exceed the maximum loop value when it is determined that the initial read operation has failed.

11. A method of driving a flash memory device, having a memory cell array for storing set information regarding operation environment settings, the method comprising:
applying power to the flash memory device;
performing an initial read operation on the memory cell array; and
judging a status of data, corresponding to the set information, read during the initial read operation to determine whether the initial read operation has passed or failed,
wherein the set information comprises at least one bit, each bit of the set information being extended to n bits (where n is an integer equal to or greater than 2), such that the n bits have a combination of data statuses using a coding method,
wherein performing the initial read operation comprises simultaneously outputting the extended n bits according to a single address, and
wherein the judging of the status of the set information data read during the initial read operation comprises judging a status of the extended n bits to determine whether the initial read operation has passed or failed.

12. The method of claim 11, wherein determining whether the initial read operation has passed or failed comprises decoding the extended n bits by inverting at least one of the extended n bits and judging a status of the decoded n bits to determine whether the initial read operation has passed or failed.

13. A flash memory device comprising:
a memory cell array for storing set information regarding operation environment settings and comprising a plurality of input/output regions from which data is output according to a single address;
a data determination unit for receiving data corresponding to the set information, read during an initial read operation when power is applied to the flash memory device, and for determining a status of the data; and
a control logic circuit for controlling the initial read operation and an operation environment settings operation of the flash memory device according to the determined status of the data,
wherein the set information comprises at least one bit, each bit of the set information being extended to n bits (n is an integer equal to or greater than 2), and the n bits are respectively stored in different input/output regions in the memory cell array,
wherein the memory cell array comprises m input/output regions (where m is an integer equal to or greater than n) from which data bits are simultaneously output according to a single address, and the extended n bits are respectively stored in n input/output regions of the m input/output regions, and
wherein the data determination unit receives the extended n bits and judges a status of the extended n bits to determine whether the initial read operation has passed or failed.

14. The flash memory device of claim 13, wherein the memory cell array comprises m input/output regions (where m is an integer equal to or greater than n) from which data bits are simultaneously output according to a single address, and the extended n bits are respectively stored in n input/output regions of the m input/output regions.

15. The flash memory device claim 14, wherein determining the status of the extended n bits comprises determining whether the number of "1" bits or "0" bits in the extended n bits is the same as or greater than a predetermined reference value, the predetermined reference value corresponding to an integer.

16. The flash memory device of claim 14, wherein determining the status of the extended n bits comprises determining whether the number of "1" bits or the number of "0" bits from among the n bits is greater.

17. The flash memory device of claim 14, wherein the control logic circuit controls the set information to be read again when the initial read operation fails, 18. The flash memory device of claim 17, wherein the control logic circuit performs an operation of re-reading the set information a number of times that does not exceed a maximum loop value, corresponding to an integer, when the initial read operation has fails.

19. A flash memory device comprising:
a memory cell array for storing set information regarding operation environment settings, each bit of the set information being extended to n bits (where n is an integer equal to or greater than 2) and stored in the memory cell array;
a data determination unit for receiving the extended n bits read during an initial read operation when power is applied to the flash memory device, and for judging a status of the extended n bits to determine whether the initial read operation has passed or failed, the initial read operation comprising simultaneously outputting the extended n bits according to a single address; and
a control logic circuit for controlling the initial read operation and an operation environment settings operation of the flash memory device according to the determined status,
wherein each bit of the set information is coded into n bits having a combination of data statuses.

20. The flash memory device of claim 19, wherein the data determination unit comprises:
a decoder for receiving and decoding the extended n bits; and
a logic operation unit for judging a status of the decoded n bits to determine whether the initial read operation has passed or failed.

21. The flash memory device of claim 20, wherein the decoder comprises at least one inverter for inverting at least one bit of the extended n bits.

22. The flash memory device of claim 21, wherein the memory cell array comprises m input/output regions (where m is an integer equal to or greater than n), and the extended n bits are respectively stored in n input/output regions from among the m input/output regions.

* * * * *